US011355567B2

(12) United States Patent
Hwang et al.

(10) Patent No.: US 11,355,567 B2
(45) Date of Patent: Jun. 7, 2022

(54) DISPLAY DEVICE

(71) Applicant: Samsung Display Co., Ltd., Yongin-Si (KR)

(72) Inventors: Kyuhwan Hwang, Yongin-si (KR); Dahee Jeong, Yongin-si (KR)

(73) Assignee: Samsung Display Co., Ltd.

( * ) Notice: Subject to any disclaimer, the term of this patent is extended or adjusted under 35 U.S.C. 154(b) by 48 days.

(21) Appl. No.: 16/780,537

(22) Filed: Feb. 3, 2020

(65) Prior Publication Data

US 2020/0381489 A1 Dec. 3, 2020

(30) Foreign Application Priority Data

May 27, 2019 (KR) ........................ 10-2019-0062055

(51) Int. Cl.
*H01L 27/32* (2006.01)
(52) U.S. Cl.
CPC ........ *H01L 27/326* (2013.01); *H01L 27/3246* (2013.01); *H01L 27/3276* (2013.01)
(58) Field of Classification Search
CPC ............. H01L 27/3211; H01L 27/3218; H01L 27/326; H01L 51/5209; H01L 51/5225
See application file for complete search history.

(56) References Cited

U.S. PATENT DOCUMENTS

| 9,614,191 | B2 | 4/2017 | Madigan |
| 9,627,645 | B2 | 4/2017 | Cui et al. |
| 9,786,732 | B2 | 10/2017 | Jeon et al. |
| 9,847,486 | B2 * | 12/2017 | Park .................... H01L 27/3272 |
| 9,911,941 | B2 | 3/2018 | Choi et al. |
| 9,947,734 | B2 | 4/2018 | You et al. |
| 2012/0267611 | A1 * | 10/2012 | Chung ................ H01L 27/3272 257/40 |
| 2014/0242737 | A1 * | 8/2014 | Chung ................ H01L 51/0023 438/35 |
| 2015/0364715 | A1 * | 12/2015 | Yoon ................... H01L 51/5225 257/40 |
| 2019/0043932 | A1 * | 2/2019 | Shih .................... H01L 27/3225 |
| 2021/0047536 | A1 * | 2/2021 | Chang ..................... C07C 15/28 |

FOREIGN PATENT DOCUMENTS

| KR | 10-2016-0130042 A | 11/2016 |
| KR | 10-2017-0047473 A | 5/2017 |
| KR | 10-2017-0078909 A | 7/2017 |

* cited by examiner

*Primary Examiner* — Tuan A Hoang
(74) *Attorney, Agent, or Firm* — Innovation Counsel LLP

(57) ABSTRACT

A display device includes: a substrate; a first pixel unit disposed over the substrate and including at least two pixel areas emitting lights of different colors; a second pixel unit neighboring the first pixel unit and including at least two pixel areas emitting lights of different colors; a first opposite electrode disposed on an area corresponding to the first pixel unit; and a second opposite electrode disposed on an area corresponding to the second pixel unit, wherein the first pixel unit includes a first pixel area and a second pixel area that neighbor each other, the second pixel unit includes a third pixel area and a fourth pixel area that neighbor each other, and a first distance between the first pixel area and the second pixel area is less than a second distance between the third pixel area and the first pixel area.

23 Claims, 14 Drawing Sheets

DISPLAY DEVICE

CROSS-REFERENCE TO RELATED APPLICATION

This application claims the benefit of Korean Patent Application No. 10-2019-0062055, filed on May 27, 2019, in the Korean Intellectual Property Office, the disclosure of which is incorporated herein in its entirety by reference.

BACKGROUND

1. Field

One or more embodiments relate to a display device.

2. Description of Related Art

Recently, use of display devices has diversified. Also, as display devices have become more thinner and lighter, their range of use has gradually been extended, and research into a display device that may be utilized in various fields is in constant progress.

SUMMARY

One or more embodiments include a display device.

Additional aspects will be set forth in part in the description which follows and, in part, will be apparent from the description, or may be learned by practice of the presented embodiments of the disclosure.

According to one or more embodiments, a display device includes: a substrate; a first pixel unit disposed over the substrate and including at least two pixel areas emitting lights of different colors; a second pixel unit neighboring the first pixel unit and including at least two pixel areas emitting lights of different colors; a first opposite electrode disposed on an area corresponding to the first pixel unit; and a second opposite electrode disposed on an area corresponding to the second pixel unit, wherein the first pixel unit includes a first pixel area that neighbors the second pixel unit and a second pixel area that neighbor each other, the second pixel unit includes a third pixel area that neighbors the first pixel unit and a fourth pixel area that neighbor each other, and a first distance between the first pixel area and the second pixel area is less than a second distance between the third pixel area and the first pixel area The first opposite electrode may be a single body covering the first pixel area and the second pixel area, and the second opposite electrode is a single body covering the third pixel area and the fourth pixel area that neighbors the third pixel area.

An end portion of the first opposite electrode and an end portion of the second opposite electrode may overlap each other.

The end portion of the first opposite electrode may directly contact the end portion of the second opposite electrode.

An overlapping part of the end portion of the first opposite electrode and the end portion of the second opposite electrode may be disposed between the first pixel area and the third pixel area.

The first opposite electrode and the second opposite electrode may include the same material.

The display device may further include: a first pixel electrode disposed in the first pixel area, a second pixel electrode disposed in the second pixel area, and a third pixel electrode disposed in the third pixel area; and a pixel-defining layer including openings respectively overlapping the first pixel electrode, the second pixel electrode, and the third pixel electrode.

Each of an edge of the first opposite electrode and an edge of the second opposite electrode may be disposed on a top surface of a portion of the pixel-defining layer disposed between the first pixel electrode and the third pixel electrode.

The substrate may include a transmissive area that neighbors the first pixel unit and the second pixel unit, and the pixel-defining layer may include a hole corresponding to the transmissive area.

An edge of one of the first opposite electrode and the second opposite electrode may neighbor an edge of the pixel-defining layer defining the hole.

According to one or more embodiments, a display device includes: a substrate; a first pixel unit disposed over the substrate and including a first pixel area and a second pixel area emitting lights of different colors; a second pixel unit neighboring the first pixel unit and including a third pixel area that neighbors the first pixel unit and a fourth pixel area emitting lights of different colors; a first pixel electrode disposed in the first pixel area; a second pixel electrode disposed in the second pixel area that neighbors the first pixel area; a third pixel electrode disposed in the third pixel area; and a pixel-defining layer including openings respectively overlapping the first pixel electrode, the second pixel electrode, and the third pixel electrode, wherein a first width of a first potion of the pixel-defining layer that is disposed between the first pixel electrode and an edge of the second pixel electrode may be less than a second width of a second portion of the pixel-defining layer that is disposed between the first pixel electrode and the third pixel electrode.

The display device may further include: a first opposite electrode and a second opposite electrode that are disposed respectively corresponding to the first pixel unit and the second pixel unit, wherein the first opposite electrode may be electrically connected to the second opposite electrode.

An end portion of the first opposite electrode and an end portion of the second opposite electrode may directly contact each other.

The end portion of the first opposite electrode and the end portion of the second opposite electrode may overlap each other.

A contact area of the first opposite electrode and the second opposite electrode may be disposed between the first pixel area and the third pixel area.

The first opposite electrode and the second opposite electrode may include the same material.

The first opposite electrode and the second opposite electrode each may include Ag, Mg, or an alloy of Ag and Mg.

A first gap between the first pixel electrode and the second pixel electrode may be less than a second gap between the first pixel electrode and the third pixel electrode.

The substrate may include a transmissive area that neighbors the first pixel unit and the second pixel unit, and the pixel-defining layer may include a hole corresponding to the transmissive area.

The first pixel electrode, the second pixel electrode, and the third pixel electrode each may include a reflective layer.

The above and other aspects, features, and advantages of certain embodiments of the disclosure will be more apparent from the following description, claims, and the accompanying drawings.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
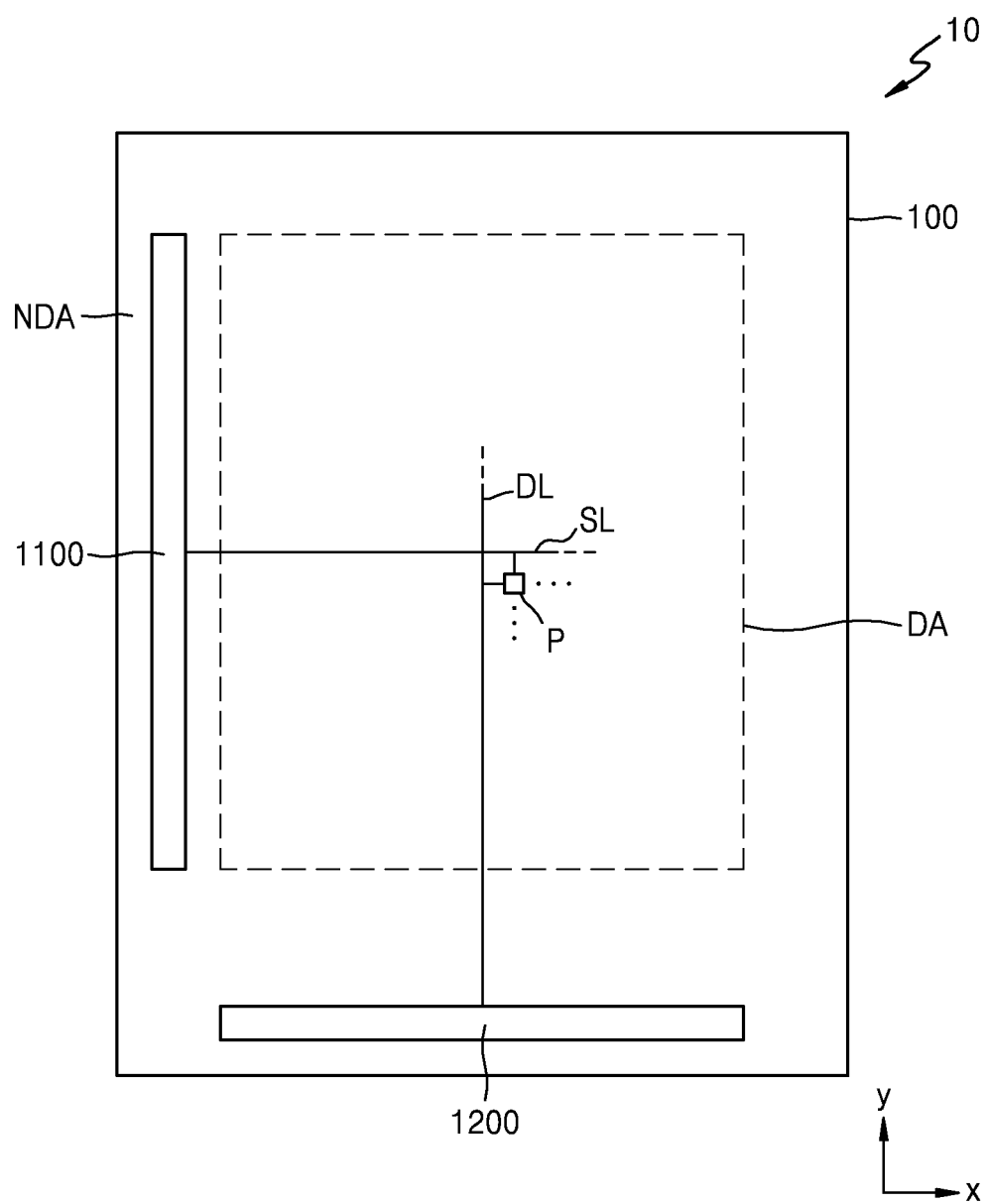
FIG. 1 is a plan view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view of a display device 10 according to an embodiment.

Referring to FIG. 1, the display device 10 may include a display area DA and a non-display area NDA that neighbors the display area DA. The display device 10 includes a plurality of pixel areas P arranged in the display area DA. A display element may be disposed in each of the pixel areas P. The display element may emit light of a predetermined color. In the present specification, a pixel area P denotes an emission area that emits light having a predetermined color. The display element may be electrically connected to a pixel circuit which is electrically connected scan line SL and a data line DL. FIG. 1 shows a substrate 100 of the display device 10 according to an embodiment. For example, the substrate 100 may include the display area DA and the non-display area NDA.

A scan driver 1100, a data driver 1200, and a main power line may be disposed in the non-display area NDA. The scan driver 1100 may provide a scan signal to each pixel circuit through a scan line SL, the data driver 1200 may provide a data signal to each pixel circuit through a data line DL, and the main power line may provide a first power voltage or a second power voltage to each pixel circuit.

Though it is shown in FIG. 1 that the data driver 1200 is arranged on the substrate 100, the data driver 1200 may be disposed on a flexible printed circuit board (FPCB) electrically connected to a pad arranged on one side of the display device 10 in another embodiment.

The display device 10 according to an embodiment may include an organic light-emitting display, an inorganic light-emitting display, and a quantum dot display. Though a display device according to an embodiment is described as an organic light-emitting display device as an example, a display device according to the present disclosure is not limited thereto and characteristics described below are applicable to various types of display devices.

Figure 2:
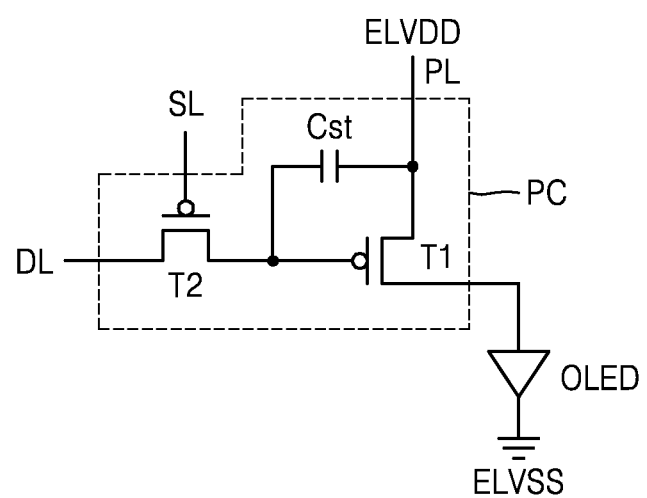
FIG. 2 is a view of a display element and a pixel circuit connected thereto, the display element being arranged in one of the pixel areas of a display device according to an embodiment.

FIG. 2 is a view of a display element and a pixel circuit PC connected thereto, according to an embodiment.

Referring to FIG. 2, an organic light-emitting diode OLED, which is a display element, is connected to the pixel circuit PC. The pixel circuit PC may include a first thin film transistor T1, a second thin film transistor T2, and a storage capacitor Cst. The organic light-emitting diode OLED may emit, for example, red, green, or blue light or emit red, green, blue, or white light.

The second thin film transistor T2 may be a switching thin film transistor and is connected to a scan line SL and a data line DL. The second thin film transistor T2 transfers a data voltage input through the data line DL to the first thin film transistor T1 in response to a switching voltage input through the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied through the driving voltage line PL.

The first thin film transistor T1 may be a driving thin film transistor, be connected to the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness according to the driving current. An opposite electrode (e.g. a cathode) of the organic light-emitting diode OLED may receive a second power voltage ELVSS.

Though it is described in FIG. 2 that the pixel circuit PC includes two thin film transistors and one storage capacitor, the number of thin film transistors and the number of storage capacitors may be variously changed depending on a design of the pixel circuit PC in another embodiment.

Figure 3:
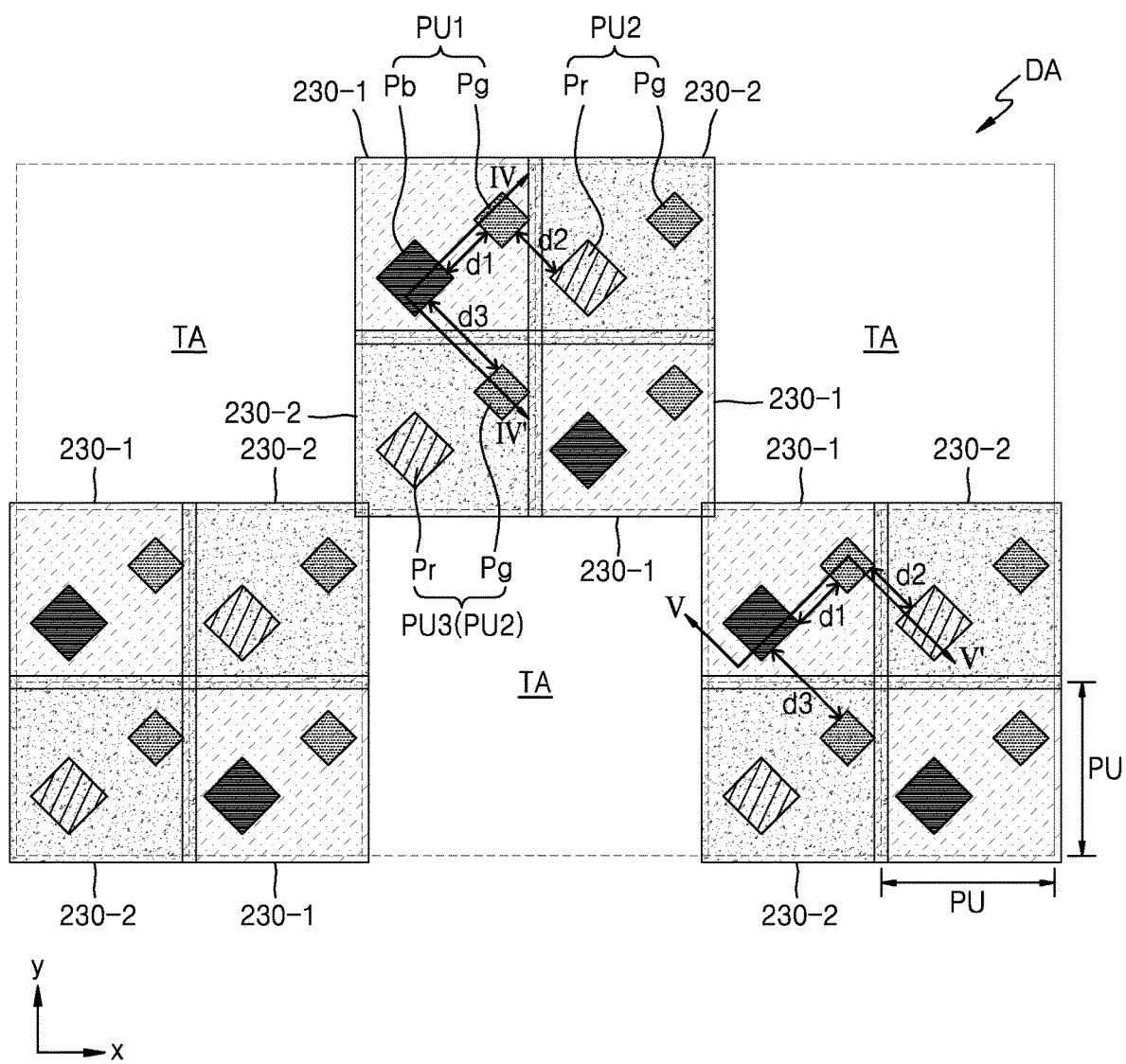
FIG. 3 is a plan view of a portion of a display device according to an embodiment.

FIG. 3 is a plan view of a portion of a display device according to an embodiment.

The display area DA may include a transmissive area TA. In an embodiment, as shown in FIG. 3, the display area DA may include a plurality of transmissive areas TA, and neighboring transmissive areas TA may be apart from each other.

The transmissive area TA is an area in which a display element is not arranged. For example, a layer(s) constituting an organic light-emitting diode, which is a display element, is not arranged in the transmissive area TA. Elements of a pixel circuit connected to the organic light-emitting diode, for example, a thin film transistor and a storage capacitor are not arranged in the transmissive area TA.

At least one pixel unit PU may be arranged between neighboring transmissive areas TA. For example, as shown in FIG. 3, four pixel units PU may be arranged between neighboring transmissive areas TA.

Each pixel unit PU may include at least two pixel areas. In an embodiment, a first pixel unit PU1 may include a blue pixel area Pb and a green pixel area Pg, and a second pixel unit PU2 may include a red pixel area Pr and a green pixel area Pg. In the present specification, a pixel area may be an emission area that emits light having a predetermined color as described above. That is, as shown in FIG. 3, a blue pixel area Pb is a blue emission area that emits blue light, a green pixel area Pg is a green emission area that emits green light, and a red pixel area Pr is a red emission area that emits red light.

Pixel areas arranged in the display area DA may have a structure in which blue and green pixel areas Pb and Pg, and red and green pixel areas Pr and Pg are arranged in a pentile type. For example, pentile type blue, green, red, and green pixel areas Pb, Pg, Pr, and Pg may be arranged in the display area DA. In some embodiment, the first pixel unit PU1 and the second pixel unit PU2 are alternatively arranged along the x-direction and the y-direction in the display area DA.

In an embodiment, as shown in FIG. 3, adjacent green pixel areas Pg may be arranged in the x-direction and the y-direction. Adjacent blue pixel areas Pb may be arranged in a first oblique direction that is oblique with respect to x and y directions. Likewise, Adjacent red pixel areas Pr may be arranged in a second oblique direction that is oblique with respect to x and y directions. A blue pixel area Pb and a red pixel area Pr that is adjacent to each other may be arranged in the x-direction and the y-direction. In some embodiment, locations between the blue pixel area Pr and the red pixel area Pr may be changed each other. For example, the first pixel unit PU1 may include the red and green pixel areas Pr and Pg, and the second pixel unit PU2 may include the blue and green pixel areas Pb and Pg. That is, the locations the first and second pixel unit PU1 and PU2 may be changed each other.

An organic light-emitting diode, which is a display element, is located in each pixel areas included in each pixel unit PU. The organic light-emitting diode including a pixel electrode, an emission layer, and an opposite electrode. Though a pixel electrode of an organic light-emitting diode is disposed for each pixel area, an opposite electrode may be arranged for each pixel unit PU. For example, two pixel electrodes are arranged to respectively correspond to blue and green pixel areas Pb and Pg in a first pixel unit PU1 of FIG. 3. In contrast, a first opposite electrode 230-1 may be arranged to cover the blue and green pixel areas Pb and Pg included in the first pixel unit PU1. Similarly, two pixel electrodes are arranged to respectively correspond to red and green pixel areas Pr and Pg in a second pixel unit PU2. In contrast, a second opposite electrode 230-2 may be arranged to correspond to the second pixel unit PU2, for example, to cover the red and green pixel areas Pr and Pg included in the second pixel unit PU2.

The first opposite electrodes 230-1 and the second opposite electrodes 230-2 are alternately arranged. For example, a second opposite electrode 230-2 may be arranged between the first opposite electrodes 230-1 that neighbor each other in an x-direction and a y-direction, and a first opposite electrode 230-1 may be arranged between the second opposite electrodes 230-2 that neighbor each other in the x-direction and the y-direction.

End portions of the opposite electrodes that neighbor each other, for example, the first opposite electrodes 230-1 and the second opposite electrodes 230-2 may overlap each other and thus be electrically connected to each other. Each opposite electrode may be patterned by using a mask including an opening provided to a location at which the opposite electrode is to be formed. For example, the first opposite electrodes 230-1 are patterned first by using a mask, and then the mask is moved and the second opposite electrodes 230-2 may be patterned by using the mask. Alternatively, the second opposite electrode 230-2 may be patterned by using a second mask different from a first mask that is used for forming the first opposite electrodes 230-1.

As described above, because the first opposite electrodes 230-1 and the second opposite electrodes 230-2 are individually formed, the opposite electrode is not arranged in the transmissive area TA, and thus the transmittance of the transmissive area TA may be improved. As a comparative example, in the case where an opposite electrode formed as one body is disposed so as to cover the display area DA, because a portion of the opposite electrode formed as one body covers the transmissive area TA, the transmittance of the transmissive area TA is greatly reduced. In contrast, according to the present disclosure, as described above, because each of the opposite electrodes is arranged for each predetermined unit (for example, because each opposite electrode is arranged for each pixel unit), the transmittance of the transmissive area TA may be sufficiently secured.

A distance between neighboring pixel areas in each pixel unit PU may be less than a distance between pixel areas disposed in different pixel units PU neighboring the each pixel unit PU. For example, a distance between a first pixel area and a second pixel area included in one of the pixel units PU may be less than a distance between the first pixel area of the one pixel unit PU and a third pixel area of neighboring another pixel unit PU (here, the first pixel area neighbors the third pixel area).

In an embodiment, as shown in FIG. 3, a first distance d1 between a blue pixel area Pb and a green pixel area Pg of the first pixel unit PU1 is less than a second distance d2 between the green pixel area Pg of the first pixel unit PU1 and a red pixel area Pr of the second pixel unit PU2. Here, the green pixel area Pg of the first pixel unit PU1 neighbors the red pixel area Pr of the second pixel unit PU2. Likewise, a first distance d1 between the blue pixel area Pb and the green pixel area Pg of the first pixel unit PU1 is less than a third distance d3 between the blue pixel area Pb of the first pixel unit PU1 and a green pixel area Pg of a third pixel unit PU3. Here, the blue pixel area Pb of the first pixel unit PU1 neighbors the green pixel area Pg of the third pixel unit PU3. In the present specification, a distance between neighboring pixel areas means a shortest distance between the neighboring pixel area. For preventing short-circuit between the pixel electrodes 210 that neighbor each other, the first distance d1 may be about at least 10 µm. In an embodiment, the first distance d1 may be about at least 15 µm.

As described above, when the first distance d1 is less than the second distance d2 and the third distance d3, a margin in a process of patterning the first opposite electrode 230-1 and the second opposite electrode 230-2 may be secured, and sufficient contact between the first opposite electrode 230-1 and the second opposite electrode 230-2 may be sufficiently secured.

Figure 4:
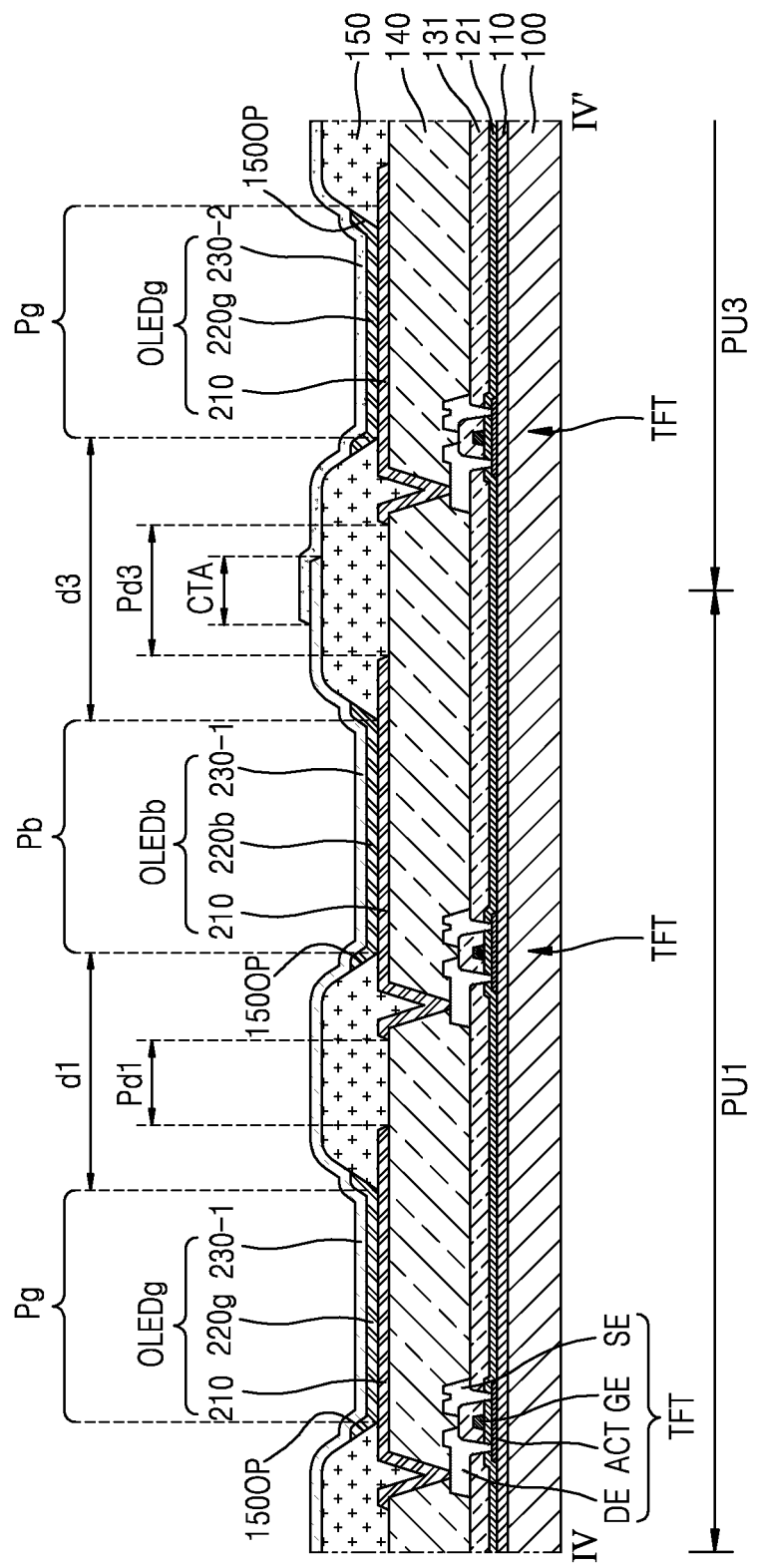
FIG. 4 is a cross-sectional view of the display device taken along line IV-IV' of FIG. 3.
Figure 5:
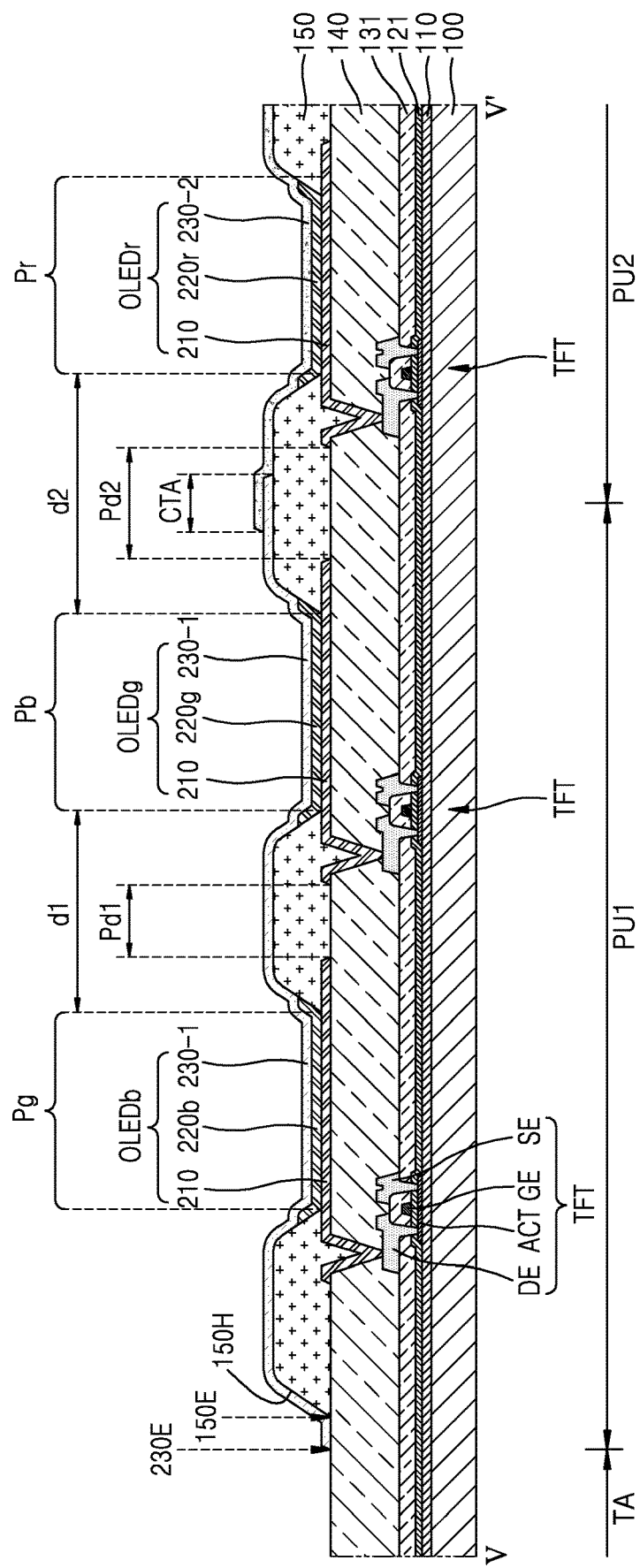
FIG. 5 is a cross-sectional view of the display device taken along line V-V' of FIG. 3.

FIGS. 4 and 5 are views of a portion of a display device according to an embodiment, FIG. 4 corresponds to a cross-section of the display device taken along line IV-IV' of FIG. 3A, and FIG. 5 corresponds to a cross-section of the display device taken along line V-V' of FIG. 3.

An organic light-emitting diode is arranged in each pixel area. With regard to this, FIGS. 4 and 5 show thin film transistors TFT, for example, a driving thin film transistor T1 in FIG. 2, and organic light-emitting diodes OLEDb, OLEDg, and OLEDr connected to the thin film transistors TFT, the thin film transistors TFT and the organic light-emitting diodes OLEDb, OLEDg, and OLEDr being arranged over a substrate 100, and being elements of a pixel circuit.

The substrate 100 may include glass or a polymer resin. The polymer resin may include polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), and/or cellulose acetate propionate (CAP). The substrate 100 including the polymer resin may be flexible, rollable, or bendable. The substrate 100 may have a multi-layered structure including a layer including a polymer resin, and an inorganic layer (not shown).

The thin film transistor TFT may include a semiconductor layer ACT, a gate electrode GE, a source electrode SE, and a drain electrode DE, the semiconductor layer ACT including amorphous silicon, polycrystalline silicon, or an organic semiconductor material. To secure insulation between the semiconductor layer ACT and the gate electrode GE, a gate insulating layer 121 may be disposed between the semiconductor layer ACT and the gate electrode GE, the gate insulating layer 121 including an inorganic material such as silicon oxide, silicon nitride and/or silicon oxynitride. An interlayer insulating layer 131 may be disposed on the gate electrode GE, the interlayer insulating layer 131 including an inorganic material such as silicon oxide, silicon nitride and/or silicon oxynitride. The source electrode SE and the drain electrode DE may be disposed on the interlayer insulating layer 131. The insulating layer including an inorganic material may be formed by chemical vapor deposition (CVD) or atomic layer deposition (ALD).

The gate electrode GE, the source electrode SE, and the drain electrode DE may include various conductive materials. The gate electrode GE may include molybdenum or aluminum, and when needed, may have a multi-layered structure. For example, the gate electrode GE may include a single layer of molybdenum or have a three-layered structure including a molybdenum layer, an aluminum layer, and a molybdenum layer. The source electrode SE and the drain electrode DE may include titanium or aluminum, and when needed, have a multi-layered structure. In an embodiment, the source electrode SE and the drain electrode DE may have a three-layered structure including a titanium layer, an aluminum layer, and a titanium layer.

A buffer layer 110 may be disposed between the thin film transistor TFT having the above-described structure and the substrate 100, the buffer layer 110 including an inorganic material such as silicon oxide, silicon nitride, and/or silicon oxynitride. The buffer layer 110 may increase flatness of a top surface of the substrate 100 and/or prevent or minimize the penetration of impurities into the semiconductor layer ACT of the thin film transistor TFT from the substrate 100.

A planarization insulating layer 140 may be disposed on the thin film transistor TFT. The planarization insulating layer 140 may include an organic material such as acryl, benzocyclobutene (BCB), or hexamethyldisiloxane (HMDSO). Though it is shown in FIG. 4 that the planarization insulating layer 140 includes a single layer, the planarization insulating layer 140 may include a multi-layer which includes an inorganic material and/or an organic material.

The thin film transistor TFT may have the same structure for each pixel circuit. For example, as shown in FIG. 4, each of thin film transistors TFT of a pixel circuit corresponding to a green pixel area Pg may have the same structure as that of a thin film transistor TFT of a pixel circuit corresponding to a blue pixel area Pb. Also, a thin film transistor TFT of a pixel circuit corresponding to a red pixel area Pr shown in FIG. 5 may have the same structure as that of a thin film transistor TFT of a pixel circuit corresponding to a blue pixel area Pb.

The thin film transistors TFT are respectively connected to the organic light-emitting diodes OLEDb, OLEDg, and OLEDr. For example, as shown in FIGS. 4 and 5, each of the organic light-emitting diode OLEDb that emits blue light, the organic light-emitting diode OLEDg that emits green light, and the organic light-emitting diode OLEDr that emits red light is connected to a respective thin film transistor TFT.

The pixel electrode 210 of each of the organic light-emitting diodes OLEDb, OLEDg, and OLEDr may be disposed on the planarization insulating layer 140. The pixel electrodes 210 may be spaced apart from each other and each of the pixel electrodes 210 may have an island shape. The pixel electrode 210 may include a (semi) transparent electrode or a reflective electrode. In an embodiment, the pixel electrode 210 may include a reflective electrode and a transparent or semi-transparent electrode layer disposed on the reflective layer, the reflective electrode including at least one of Ag, Mg, Al, Pt, Pd, Au, Ni, Nd, Ir, Cr, or a compound thereof. The transparent or semi-transparent electrode layer may include at least one of indium tin oxide (ITO), indium zinc oxide (IZO), zinc oxide (ZnO), or indium oxide ($In_2O_3$), indium gallium oxide (IGO), or aluminum zinc oxide (AZO). In an embodiment, the pixel electrode 210 may have a three-layered structure of an ITO layer, an Ag layer, and an ITO layer.

A pixel-defining layer 150 is disposed on the pixel electrode 210. The pixel-defining layer 150 includes an opening 150OP exposing a central portion of each pixel electrode 210, the opening 150OP corresponding to an emission area. The pixel-defining layer 150 may prevent an arc, etc. from occurring at the edges of the pixel electrode 210 by increasing a distance between the opposite electrodes (e.g. the first opposite electrode 230-1 and the second opposite electrode 230-2) and the edges of the pixel electrode 210. The pixel-defining layer 150 may include an organic insulating material such as polyimide, polyamide, an acrylic resin, BCB, HMDSO, or a phenolic resin, and may be formed by a method such as spin coating.

An emission layer may be disposed on a portion of the pixel electrode 210 that is exposed through the opening 150OP of the pixel-defining layer 150. A blue emission layer 220b is disposed on the pixel electrode 210 corresponding to the blue pixel area Pb, a green emission layer 220g is disposed on the pixel electrode 210 corresponding to the green pixel area Pg, and a red emission layer 220r is disposed on the pixel electrode 210 corresponding to the red pixel area Pr. The blue emission layer 220b may include an organic material including a fluorescent or phosphorous material that may emit blue light, the green emission layer 220g may include an organic material including a fluorescent or phosphorous material that may emit green light, and the red emission layer 220r may include an organic material including a fluorescent or phosphorous material that may emit red light. The organic material that emits red, green, or blue light may include a low molecular weight organic material or a polymer organic material.

A first functional layer and a second functional layer may be respectively disposed on and under the blue emission layer 220b, the green emission layer 220g, and the red emission layer 220r. The first functional layer may include a hole transport layer and/or a hole injection layer, and the second functional layer may include an electron injection layer and/or an electron transport layer. The first functional layer and the second functional layer may be formed as one body so as to entirely cover the display area DA. Therefore, the transmissive area TA may be covered by the first functional layer and the second functional layer. Alternatively, the first functional layer and the second functional layer may include an opening corresponding to the transmissive area TA. The first functional layer and the second functional layer may be selectively provided depending on necessity. For example, in an embodiment, both the first functional layer and the second functional layer may be provided, and in another embodiment, the second functional layer may be omitted.

The opposite electrodes, for example, the first opposite electrode 230-1 and the second opposite electrode 230-2 may be alternately disposed and respectively arranged so as to cover pixel areas of a corresponding pixel unit. For example, as shown in FIGS. 3 to 5, one of the first opposite electrodes 230-1 may cover a blue pixel area Pb and a green pixel area Pg of the first pixel unit PU1. Similarly, one of the second opposite electrodes 230-2 may cover a red pixel area Pr and a green pixel area Pg of the second pixel unit PU2 (see FIG. 3). With regard to this, FIG. 5 shows that the second opposite electrode 230-2 disposed on the red emission layer 220r. Because the first opposite electrodes 230-1 and the second opposite electrodes 230-2 are alternately arranged as described above, the second opposite electrode 230-2 different from the second opposite electrode 230-2 shown in FIG. 5 is disposed so as to cover pixel areas of the third pixel unit PU3 as shown in FIG. 4.

The first opposite electrodes 230-1 and the second opposite electrodes 230-2 may include a (semi) transparent layer including at least one of Ag, Mg, Al, Pt, Pd, Au, Ni, Nd, Ir, Cr, Li, Ca, or an alloy thereof. Alternatively, the first opposite electrodes 230-1 and the second opposite electrodes 230-2 may further include a layer including ITO, IZO, ZnO, or $In_2O_3$ on the (semi) transparent layer including the above material. In an embodiment, each of the first opposite electrodes 230-1 and the second opposite electrodes 230-2 may include Ag, Mg, or an alloy of Ag and Mg.

Because the first opposite electrode 230-1 and the second opposite electrode 230-2 are respectively arranged in neighboring pixel units, the first opposite electrode 230-1 and the second opposite electrode 230-2 may overlap each other to be electrically connected to each other. For example, the first opposite electrode 230-1 of the first pixel unit PU1 may directly contact and overlap the second opposite electrode 230-2 of the third pixel unit PU3 in a region disposed between the first pixel unit PU1 and the third pixel unit PU3 (see FIG. 4). The first opposite electrode 230-1 of the first pixel unit PU1 may directly contact and overlap the second opposite electrode 230-2 of the second pixel unit PU2 in a region between the first pixel unit PU1 and the second pixel unit PU2 (see FIG. 5).

Because the first opposite electrode 230-1 and the second opposite electrode 230-2 are patterned so as to correspond to respective pixel units, the first opposite electrode 230-1 and the second opposite electrode 230-2 may not be located in the transmissive area TA as shown in FIGS. 3 and 5. Similarly, a material corresponding to the pixel-defining layer 150 may not be located in the transmissive area TA. For example, the pixel-defining layer 150 may include a hole 150H in areas corresponding to the transmissive area TA.

Though FIG. 5 shows the hole 150H formed in areas corresponding to the transmissive area TA formed by patterning the pixel-defining layer 150, the at least one layer including the buffer layer 110, the gate insulating layer 121, the interlayer insulating layer 131, and the planarization insulating layer 140 in the transmissive area TA may also be removed in another embodiment. For example, at least one of the buffer layer 110, the gate insulating layer 121, the interlayer insulating layer 131, and the planarization insulating layer 140 may include holes in areas corresponding to the transmissive area TA.

An edge 230E of the opposite electrode (e.g. the first opposite electrode 230-1 of FIG. 5) that neighbors the transmissive area TA may be disposed adjacent to an edge 150E of the pixel-defining layer 150. In an embodiment, the edge 230E of the opposite electrode (e.g. the first opposite electrode 230-1 of FIG. 5) that is disposed adjacent to the transmissive area TA may further extend toward the transmissive area TA beyond the edge 150E of the pixel-defining layer 150 that is disposed adjacent to the transmissive area TA, and may contact an insulating layer, for example, the planarization insulating layer 140 disposed under the pixel electrode 210. In another embodiment, the edge 230E of the opposite electrode (e.g. the first opposite electrode 230-1 of FIG. 5) that is disposed adjacent to the transmissive area TA may be located on the same vertical line as that of the edge 150E of the pixel-defining layer 150 that is disposed adjacent to the transmissive area TA. In another embodiment, the edge 150E of the pixel-defining layer 150 that is disposed adjacent to the transmissive area TA may extend further toward the transmissive area TA than the edge 230E of the opposite electrode (e.g. the first opposite electrode 230-1 of FIG. 5) that is disposed adjacent to the transmissive area TA.

A shortest distance between pixel areas (e.g., neighboring or adjacent pixel areas) of the first pixel unit PU1, for example, a first distance d1 between the green pixel area Pg and the blue pixel area Pb, corresponds to a distance between an emission area of the green organic light-emitting diode OLEDg and an emission area of the blue organic light-emitting diode OLEDb. Because an emission area of each organic light-emitting diode is substantially the same as the opening 150OP of the pixel-defining layer 150, the first distance d1 may be a width of a portion of the pixel-defining layer 150 located between the green organic light-emitting diode OLEDg and the blue organic light-emitting diode OLEDb.

The first distance d1 between neighboring pixel areas of the first pixel unit PU1 is less than a distance between one of the pixel areas of the first pixel unit PU1 and a pixel area of the second pixel unit PU2 or the third pixel unit PU3 that is disposed adjacent to the first pixel unit PU1.

For example, referring to FIGS. 3 and 4, among pixel areas disposed in different pixel units PU, the green pixel area Pg of the third pixel unit PU3 are disposed closest to the blue pixel areas Pb of the first pixel unit PU1, and the third distance d3 between the blue pixel area Pb of the first pixel unit PU1 and the green pixel area Pg of the third pixel unit PU3 is greater than the first distance d1. The third distance d3 corresponds to a shortest distance between emission areas of neighboring organic light-emitting diodes disposed in neighboring pixel units. Because the emission area is defined by the opening 150OP of the pixel-defining layer 150, the third distance d3 may be a width of a portion of the pixel-defining layer 150 disposed between the blue organic light-emitting diode OLEDb of the first pixel unit PU1 and the green organic light-emitting diode OLEDg of the third pixel unit PU3.

Similarly, referring to FIGS. 3 and 5, among pixel areas disposed in different pixel units PU, the green pixel area Pg of the first pixel unit PU1 and the red pixel area Pr of the second pixel unit PU2 are disposed closest to each other, and the second distance d2 between the green pixel area Pg of the first pixel unit PU1 and the red pixel area Pr of the second pixel unit PU2 is greater than the first distance d1. The second distance d2 corresponds to a shortest distance between emission areas of neighboring organic light-emitting diodes disposed in neighboring pixel units. Because the emission area is defined by the opening 150OP of the pixel-defining layer 150, the second distance d2 may be a width of a portion of the pixel-defining layer 150 disposed between the green organic light-emitting diode OLEDg of the first pixel unit PU1 and the red organic light-emitting diode OLEDr of the second pixel unit PU2. The second distance d2 may be the same as or different from the third distance d3.

As described above, because the second distance d2 and the third distance d3 are greater than the first distance d1, despite misalignment that may occur during the first opposite electrode 230-1 and the second opposite electrode 230-2 are patterned, an area and/or a width of an overlapping area CTA of the first opposite electrode 230-1 and the second opposite electrode 230-2 may be sufficiently secured. The overlapping area CTA of the first opposite electrode 230-1 and the second opposite electrode 230-2 overlaps a portion of the pixel-defining layer 150 (that excludes the opening 150OP of the pixel-defining layer 150 and has a predetermined volume), and does not overlap the opening 150OP of the pixel-defining layer 150.

The first opposite electrode 230-1 may include the same material as that of the second opposite electrode 230-2. Depending on the condition under which the first opposite electrode 230-1 and the second opposite electrode 230-2 are formed, an interface between the first opposite electrode 230-1 and the second opposite electrode 230-2 in the overlapping area CTA may be recognized or may not be recognized by a SEM (Scanning electron microscope) or TEM (transmission electron microscopy) image. Even if where the interface is difficult to be recognized, a portion having a thickness which is greater than the thickness of the first opposite electrode 230-1 or a thickness of the second opposite electrode 230-2 may be the overlapping area CTA. That is, a thickness of the overlapping area CTA may be sum of a thickness of the first opposite electrode 230-1 and a thickness of the second opposite electrode 230-2.

A shortest gap between pixel electrodes disposed in one pixel unit may be less than a shortest gap between pixel electrodes disposed in neighboring pixel units. For example, as shown in FIG. 4, a first gap Pd1 between the pixel electrodes 210 of the blue organic light-emitting diode OLEDb and the green organic light-emitting diode OLEDg in the first pixel unit PU1 may be less than a third gap Pd3 between the pixel electrodes 210 of a blue organic light-emitting diode OLEDb in the first pixel unit PU1 and the pixel electrode 210 of a green organic light-emitting diode OLEDg in the third pixel unit PU3. Similarly, as shown in FIG. 5, a first gap Pd1 between the pixel electrodes 210 of the blue organic light-emitting diode OLEDb and the green organic light-emitting diode OLEDg in the first pixel unit PU1 may be less than a second gap Pd2 between a pixel electrode 210 of a green organic light-emitting diode OLEDg in the first pixel unit PU1 and a pixel electrode 210 of a red organic light-emitting diode OLEDr in the second pixel unit PU2 which is disposed adjacent to the first pixel unit PU1.

Figure 6:
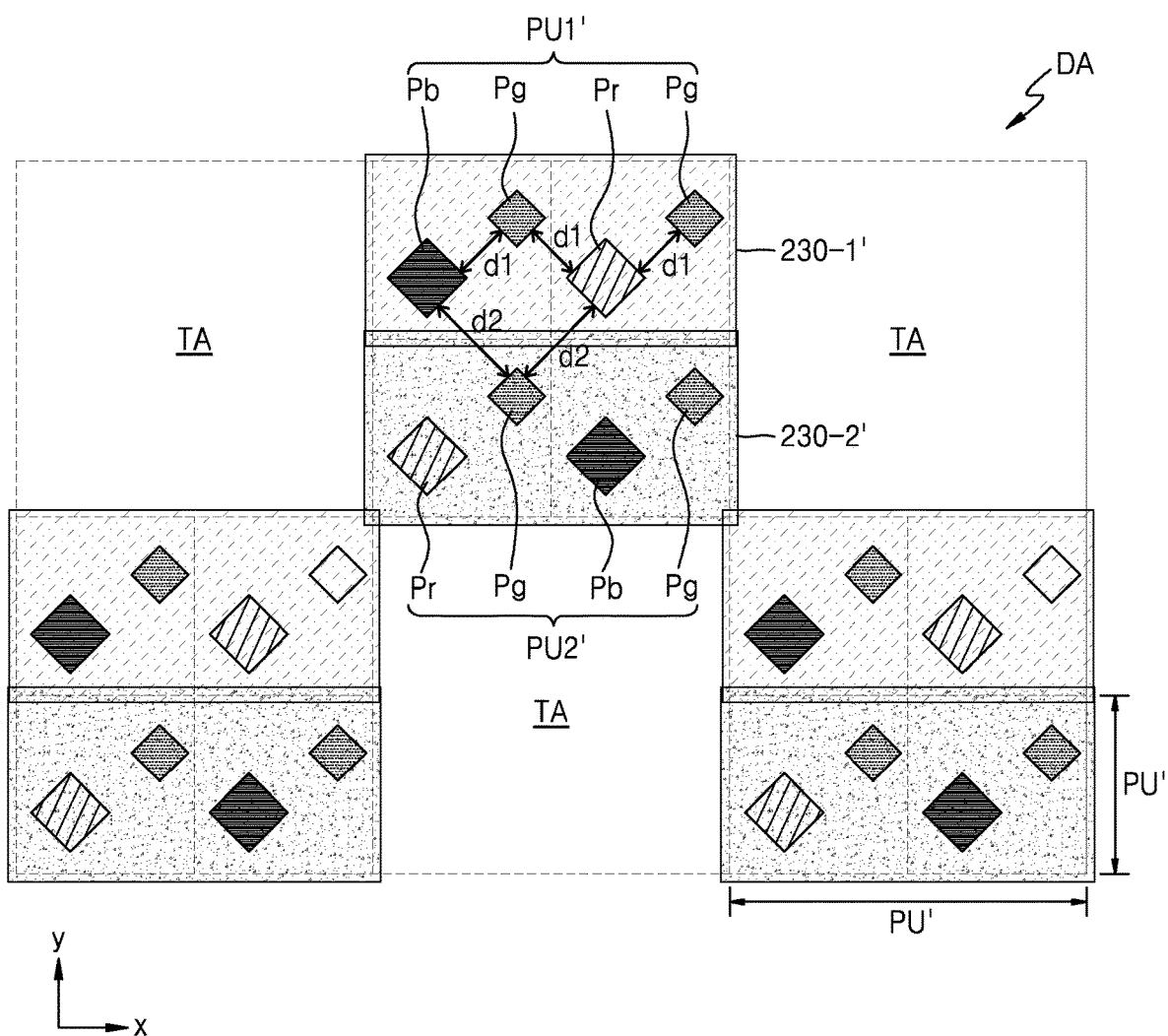
FIG. 6 is a plan view of a portion of a display device according to an embodiment.

FIG. 6 is a plan view of a portion of a display device according to an embodiment. Though it is described in FIGS. 3 to 5 that one pixel unit includes two pixel areas, the embodiment is not limited thereto. As shown in FIG. 6, each pixel unit PU' may include four pixel areas, that is, blue, green, red, and green pixel areas. For example, each of a first pixel unit PU1' and a second pixel unit PU2' may include red, green, blue, and green pixel areas Pr, Pg, Pb, and Pg.

A first opposite electrode 230-1' or a second opposite electrode 230-2' may be disposed in each of a plurality of pixel units PU'. For example, the first opposite electrode 230-1' may be disposed in the first pixel unit PU1', and the second opposite electrode 230-2' may be disposed in the second pixel unit PU2'. In other words, a group of the pixel areas corresponding to the first opposite electrode 230-1' may be the first pixel unit PU1', and a group of the pixel areas corresponding to the second opposite electrode 230-2' may be the second pixel unit PU2'.

Because the first pixel unit PU1' neighbors the second pixel unit PU2', the first opposite electrode 230-1' may neighbor and overlap the second opposite electrode 230-2' as described above.

Since the first distance d1 between neighboring pixel areas included in each pixel unit PU' is less than the second distance d2 between neighboring pixel areas selected from neighboring pixel units PU'. Therefore, an overlapping area and a contact area of the first opposite electrode 230-1' and the second opposite electrode 230-2' may be sufficiently secured. For example, the first distance d1 between neighboring pixel areas among blue, green, red, and green pixel areas Pb, Pg, Pr, and Pg of the first pixel unit PU1' is less than the second distance d2 between one pixel area (e.g. a blue pixel area Pb) of the first pixel unit PU1' and one pixel area (e.g. a green pixel area Pg) of the second pixel unit PUT' which is disposed adjacent to the first pixel unit PU1'.

Figure 7:
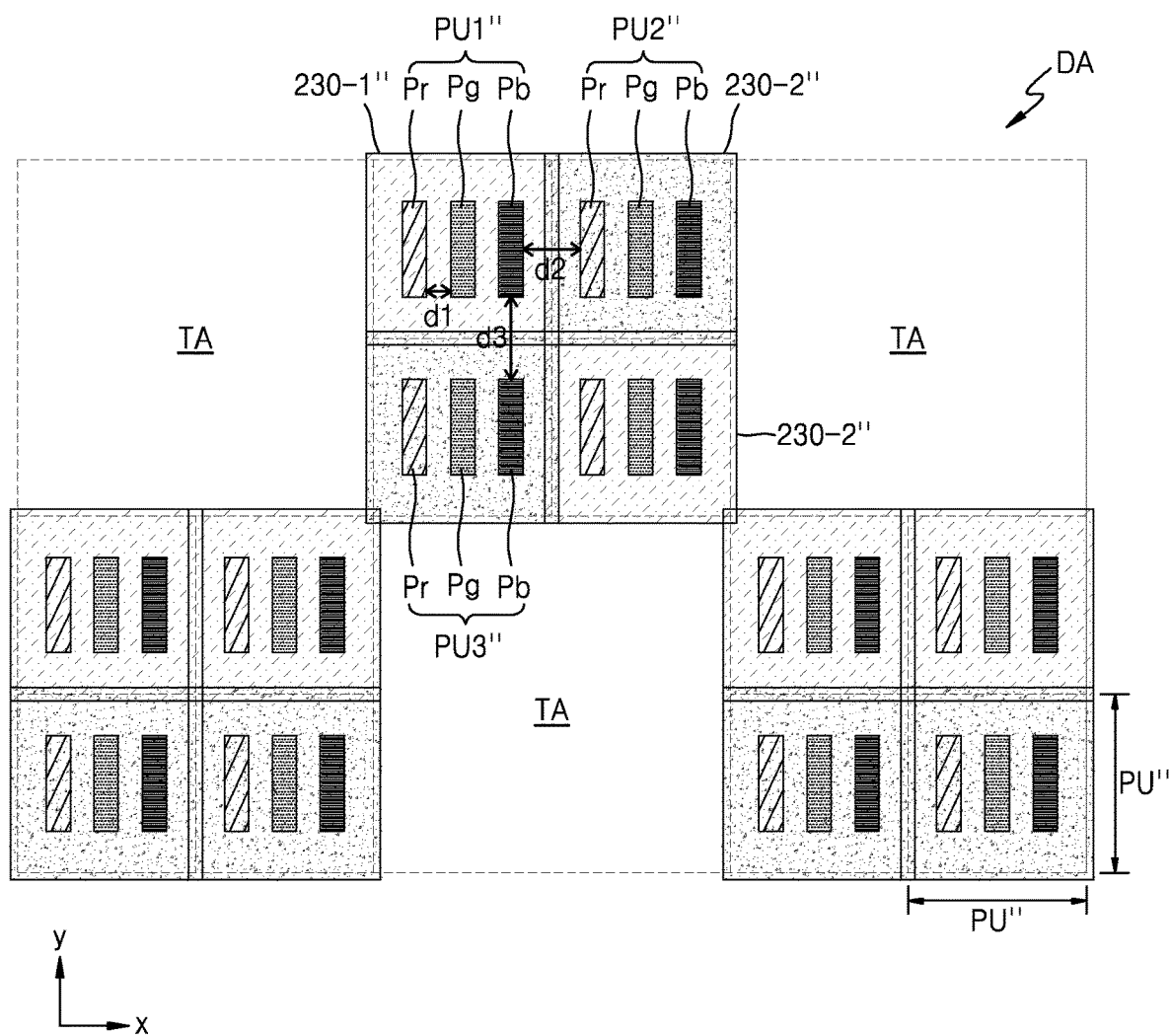
FIG. 7 is a plan view of a portion of a display device according to an embodiment.

FIG. 7 is a plan view of a portion of a display device according to another embodiment. Though it is described in FIGS. 3 to 5 that one pixel unit includes two pixels and it is described in FIG. 6 that one pixel unit includes four pixels, the embodiment is not limited thereto. As shown in FIG. 7, each pixel unit PU" may include three pixel areas, that is, red, green, and blue pixel areas Pr, Pg, and Pb. For example, each of a first pixel unit PU1" and a second pixel unit PU2" may include red, green, and blue pixel areas Pr, Pg, and Pb.

A first opposite electrode 230-1" or a second opposite electrode 230-2" may be arranged in each of a plurality of pixel units". For example, the first opposite electrode 230-1" may be disposed in the first pixel unit PU1", and the second opposite electrode 230-2" may be disposed in the second pixel unit PU2". Because the first pixel unit PU1" is disposed adjacent to the second pixel unit PU2", the first opposite electrode 230-1" may be disposed adjacent to the second opposite electrode 230-2" and end portions of the first opposite electrode 230-1" and the second opposite electrode 230-2" may overlap each other.

Because the first distance d1 between neighboring pixel areas included in each pixel unit PU" is less than the second distance d2 between neighboring pixel areas disposed in adjacent pixel units PU"'. Therefore, an overlapping area and a contact area of the first opposite electrode 230-1" and the second opposite electrode 230-2" may be sufficiently secured. For example, the first distance d1 between neighboring pixel areas among red, green, and blue pixel areas Pr, Pg, and Pb of the first pixel unit PU1" is less than the second distance d2 between one pixel area (e.g. a blue pixel area Pb) of the first pixel unit PU1" and one pixel area (e.g. a red pixel area Pr) of the second pixel unit PU2" which is disposed adjacent to the first pixel unit PU1". Similarly, the first distance d1 between neighboring pixel areas among red, green, and blue pixel areas Pr, Pg, and Pb of the first pixel unit PU1" is less than the third distance d3 between one pixel area (e.g. a blue pixel area Pb) of the first pixel unit PU1" and one pixel area (e.g. a blue pixel area Pb) of the third pixel unit PU3" which is disposed adjacent to the first pixel unit PU1". The second distance d2 may be the same as or different from the third distance d3.

Figure 8:
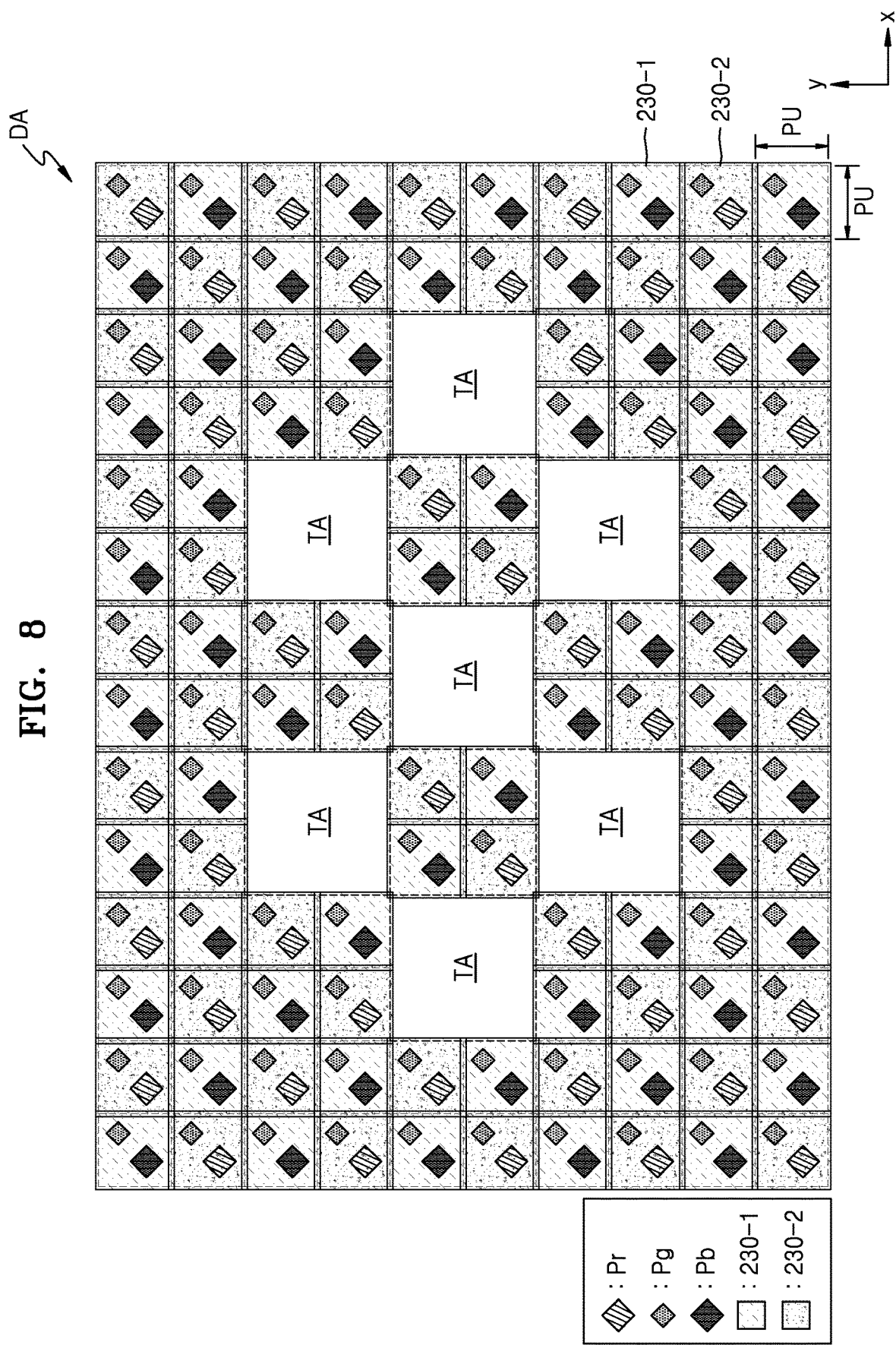
FIGS. 8, 9 and 10 are plan views of a portion of a display device according to an embodiment.
Figure 9:
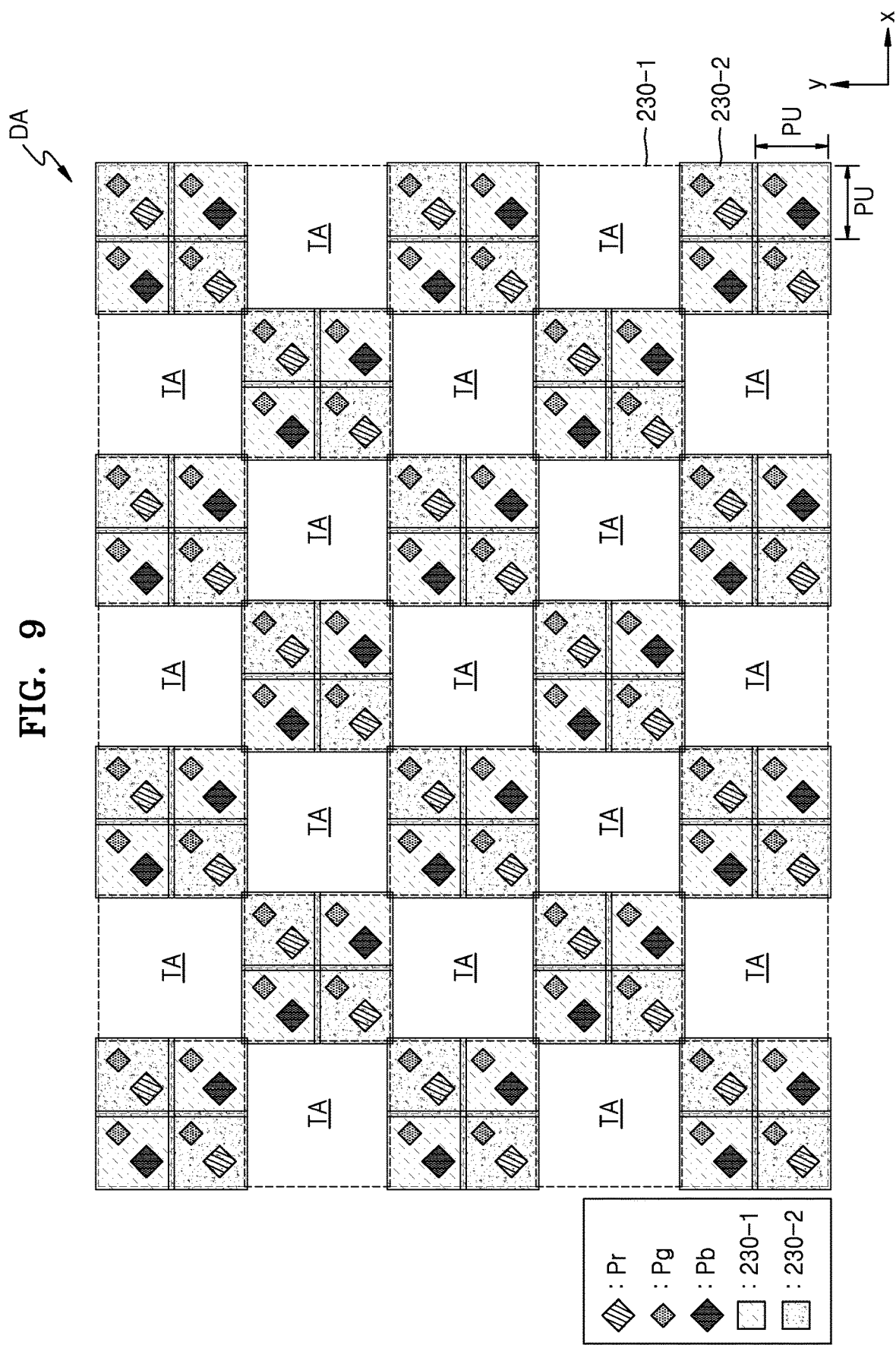
Figure 10:
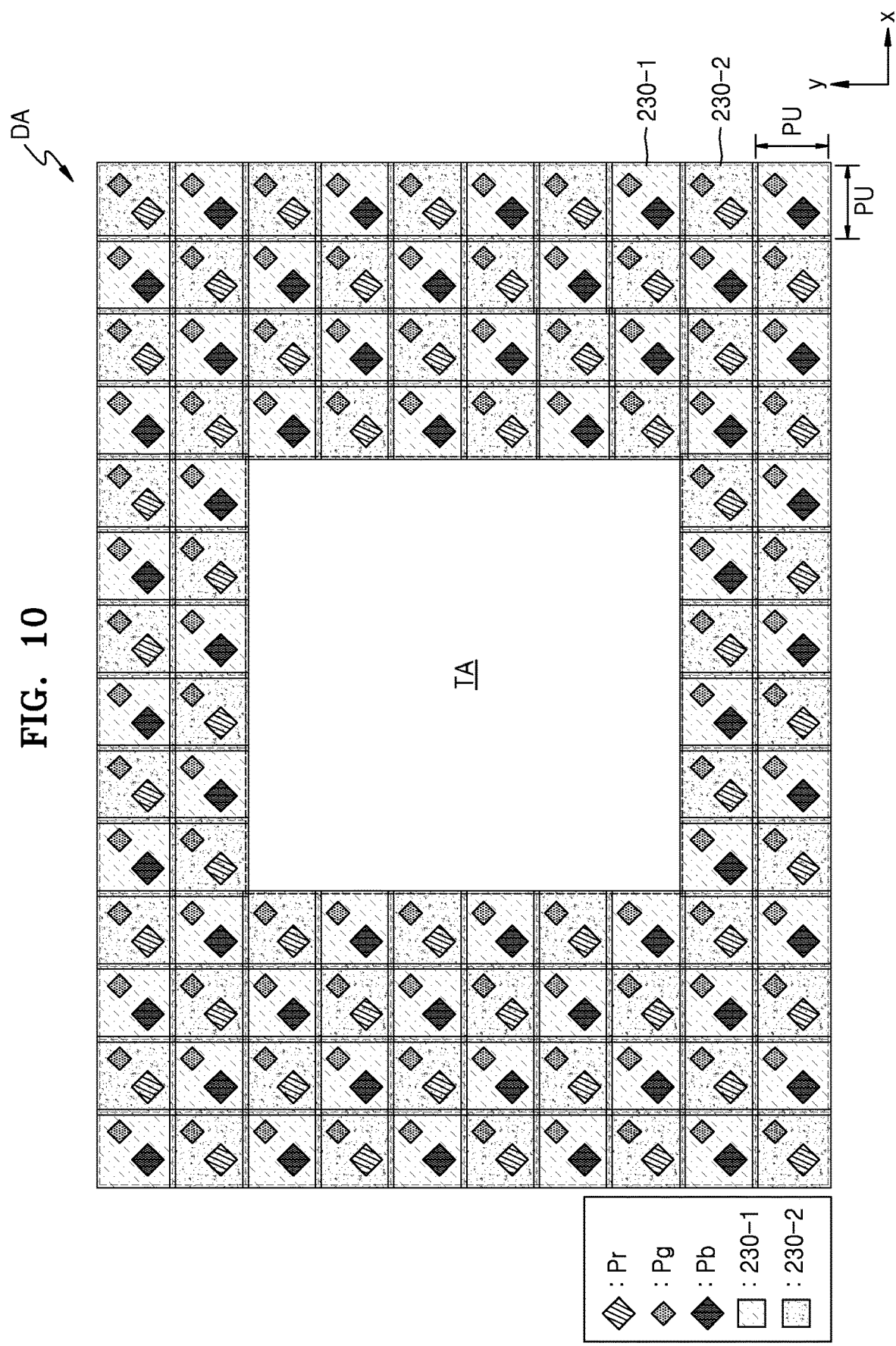

FIGS. 8 to 10 are plan views of a portion of a display device according to an embodiment, respectively.

Referring to FIGS. 8 and 9, the display area DA includes a plurality of transmissive areas TA, the transmissive areas TA being alternately arranged. The transmissive areas TA may be locally arranged in a portion of the display area DA as shown in FIG. 8, or may be alternately arranged with groups of pixel units over the entire display area DA as shown in FIG. 9. Referring to FIG. 10, the display area DA may include one transmissive area TA. One transmissive area TA may be locally located in a portion of the display area DA.

Pixel areas are not arranged in the transmissive area TA, and the first opposite electrodes 230-1 and the second opposite electrodes 230-2 may be alternately arranged in an area of the display area DA in which pixel areas are arranged.

Though it is shown in FIGS. 8 to 10 that each pixel unit includes two pixel areas, for example, the blue and green pixel areas Pb and Pg, or the green or red pixel areas Pr and Pg as described with reference to FIG. 3, each pixel unit may include four or three pixel areas as described with reference to FIGS. 6 and 7 in another embodiment.

Figure 11:
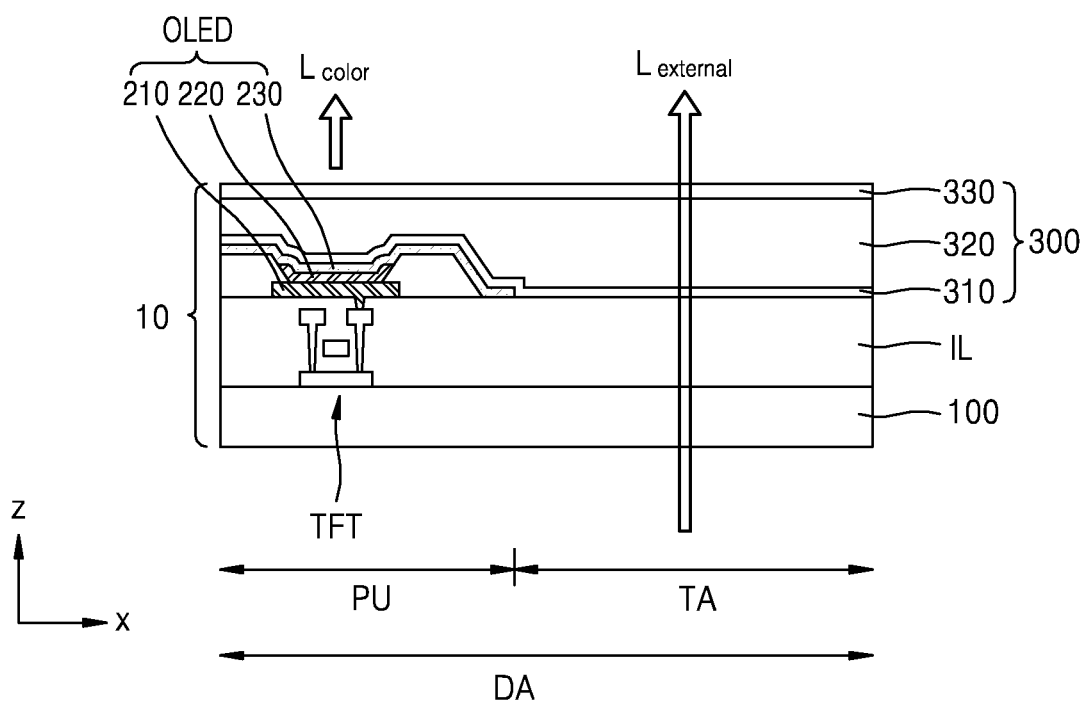
FIG. 11 is a cross-sectional view of a portion of a display device according to an embodiment.

FIG. 11 is a cross-sectional view of a portion of a display device according to an embodiment.

Referring to FIG. 11, a thin film transistor TFT is disposed over the substrate 100, and an organic light-emitting diode OLED is connected to the thin film transistor TFT. The organic light-emitting diode OLED includes the pixel electrode 210, an emission layer 220, and an opposite electrode 230. The opposite electrode 230 of FIG. 11 may correspond to the first opposite electrode 230-1 or the second opposite electrode 230-2 described with reference to FIGS. 3 to 10.

At least one insulating layer IL is disposed between the substrate 100 and the organic light-emitting diode OLED. The at least one insulating layer IL may include the buffer layer 110, the gate insulating layer 121, the interlayer insulating layer 131, and the planarization insulating layer 140 described with reference to FIGS. 4 and 5.

A thin-film encapsulation layer 300 may be disposed on the organic light-emitting diode OLED. The thin-film encapsulation layer 300 may be formed so as to entirely cover the display device 10 and may include at least one inorganic encapsulation layer and at least one organic encapsulation layer. In an embodiment, FIG. 11 shows a first inorganic encapsulation layer 310, an organic encapsulation layer 320, and a second inorganic encapsulation layer 330.

The first inorganic encapsulation layer 310 and the second inorganic encapsulation layer 330 may include at least one inorganic insulating material including aluminum oxide, titanium oxide, tantalum oxide, hafnium oxide, zinc oxide, silicon oxide, silicon nitride, or silicon oxynitride. The organic encapsulation layer 320 may include a polymer-based material. The polymer-based material may include PET, PEN, PC, PI, polyethylene sulfonate, polyoxymethylene, polyarylate, HMDSO, an acrylic-based resin (for example, polymethylmethacrylate, poly acrylic acid, etc.), or an arbitrary combination thereof.

In an area of the display area DA in which an organic light-emitting diode OLED is disposed, light $L_{color}$ having a predetermined color and emitted from the organic light-emitting diode OLED may progress toward the outside. In contrast, in the transmissive area TA, external light $L_{external}$ that is not generated or emitted from the display device 10 may pass through the display device 10 and progress in a direction (or an opposite direction) from a bottom side of the substrate 100 to the thin-film encapsulation layer 300.

Figure 12:
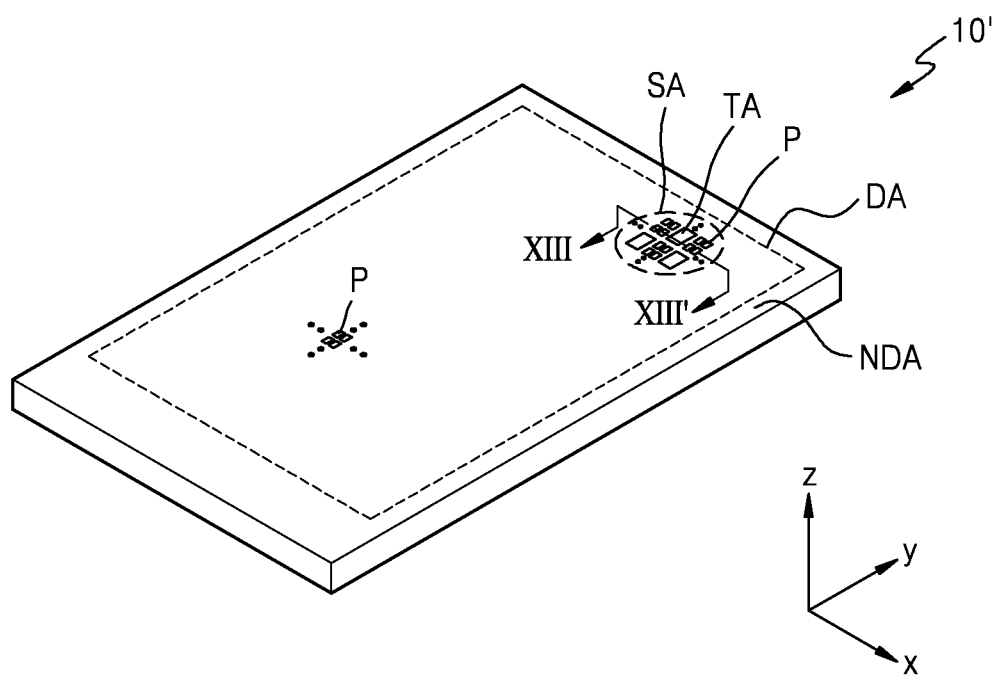
FIG. 12 is a perspective view of a display device according to an embodiment.
Figure 13:
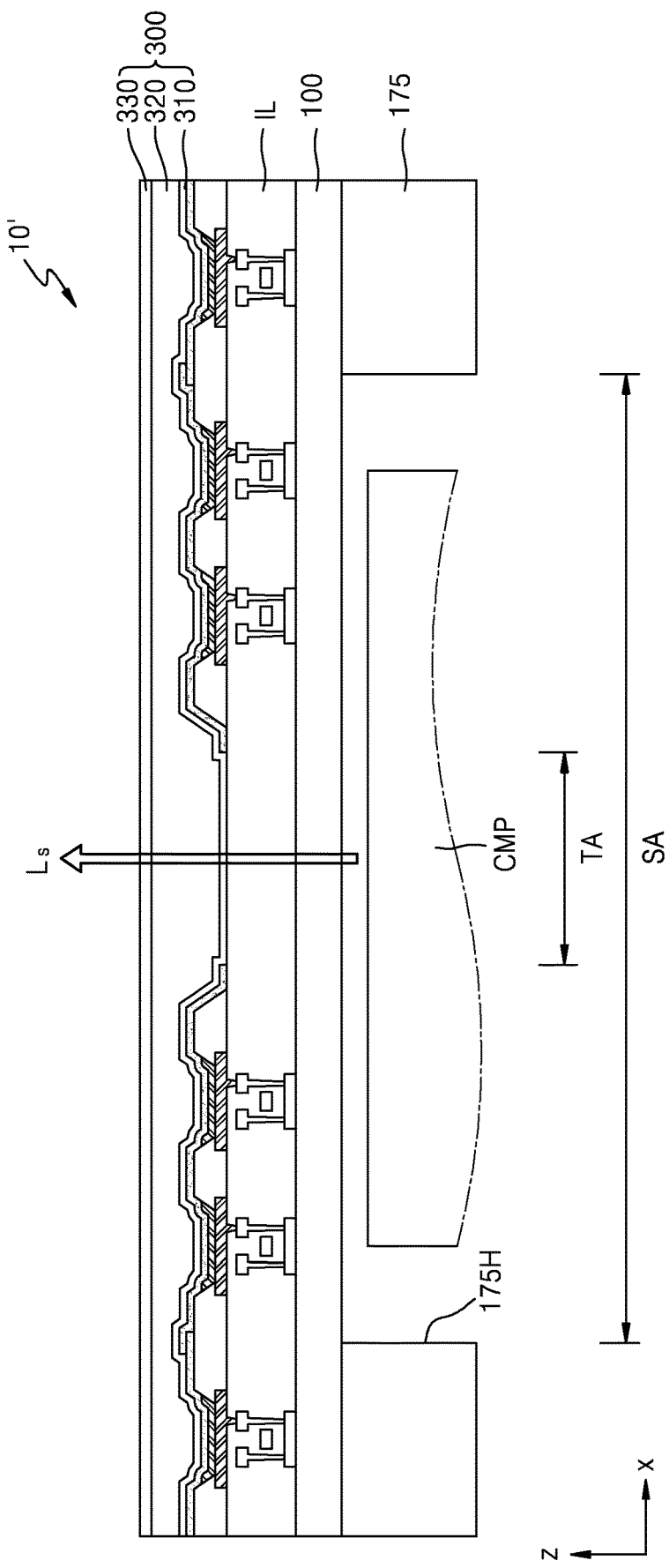
FIG. 13 is a cross-sectional view of the display device taken along line XIII-XIII' of FIG. 12.

FIG. 12 is a perspective view of a display device 10' according to another embodiment, and FIG. 13 is a cross-sectional view of the display device 10' taken along line XIII-XIII' of FIG. 12.

Referring to FIG. 12, the display device 10' may include a sensor area SA disposed inside the display area DA. Pixel areas P and the transmissive area TA may be disposed in the sensor area SA. At least two pixel areas P arranged in the sensor area SA may be included in one pixel unit. The arrangements of pixel units and transmissive areas TA may be the same as the embodiment(s) described with reference to FIGS. 3, 8 to 10 or embodiments derived therefrom.

Referring to FIG. 13, because a structure in which layers from the substrate 100 to the thin-film encapsulation layer 300 are sequentially stacked is the same as the structure described with reference to FIG. 11, a difference is mainly described below.

A component CMP may be located in the sensor area SA. The component CMP may be an electronic element that emits and/or receives light Ls. For example, the component CMP may be a sensor such as an infrared sensor that emits and/or receives light, a sensor that outputs and senses light or sound to measure a distance or recognize a fingerprint, and a small lamp that outputs light. An electronic element that uses light may use light in various wavelength bands such as visible light, infrared light, and ultraviolet light.

A lower protective film 175 may be disposed on a backside of the substrate 100 and may include a hole 175H corresponding to the sensor area SA. The lower protective film 175 may include PET or PI.

Figure 14:
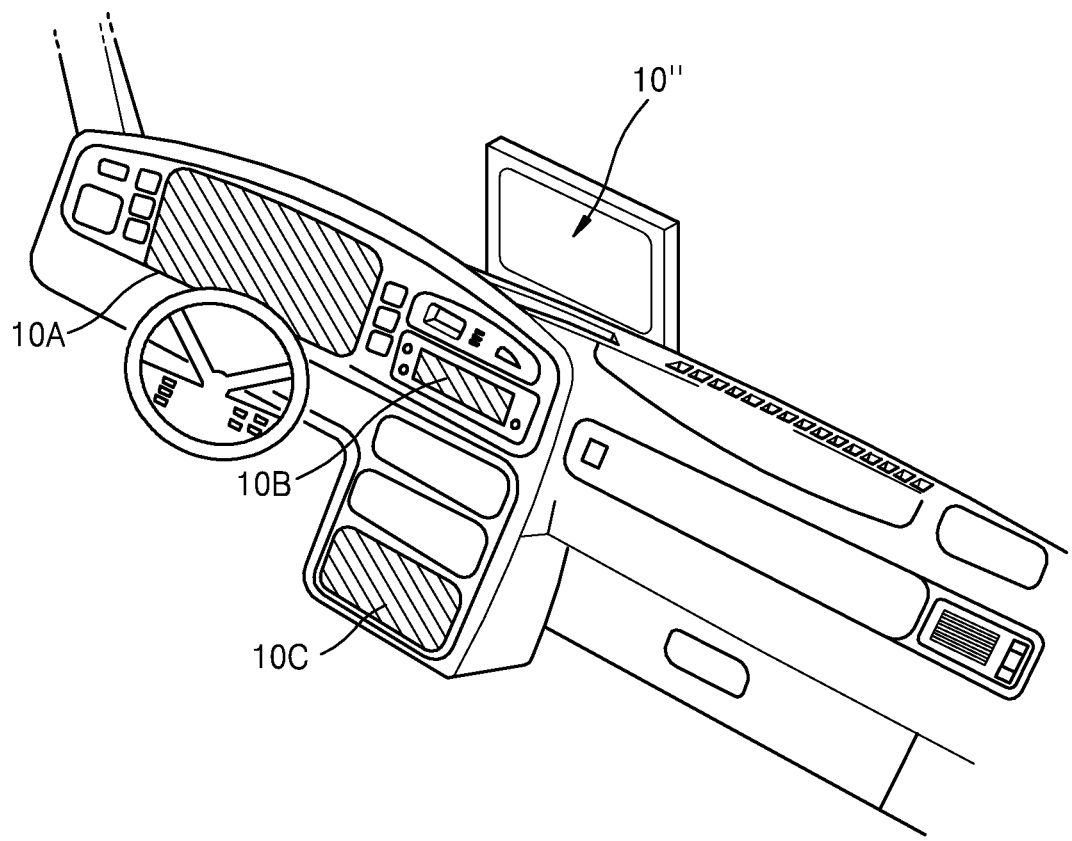
FIG. 14 is a perspective view of a display device according to an embodiment.
Figure 15:
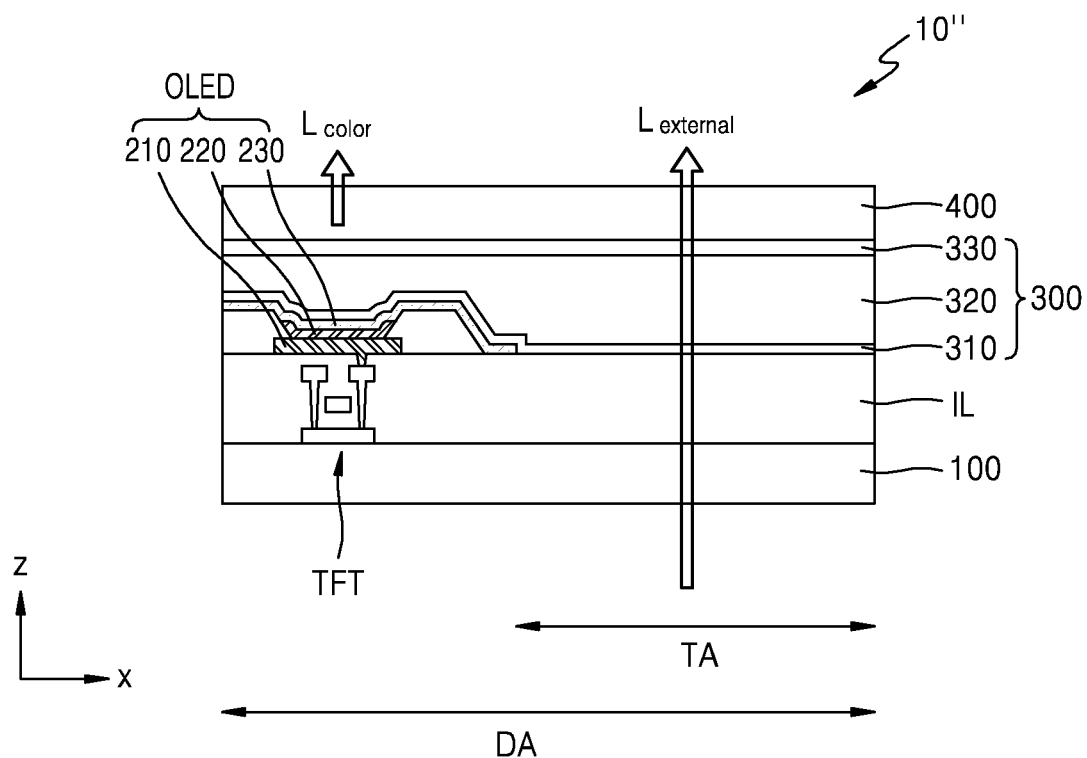
FIG. 15 is a cross-sectional view of a portion of the display device of FIG. 14.

FIG. 14 is a perspective view of a display device 10" according to another embodiment, and FIG. 15 is a cross-sectional view of a portion of the display device 10" of FIG. 14.

Referring to FIGS. 14 and 15, the display device 10" may include a head-up display device for a vehicle. The display device 10" includes transmissive areas TA provided to the display area DA. A plurality of pixel areas are arranged around the transmissive area TA, and at least two pixel areas constitute one pixel unit. The characteristics and structures of the embodiment(s) described with reference to FIGS. 3 to 10 are equally applicable to the display device 10" shown in FIGS. 14 and 15.

The display device 10" may further include an optical film 400 that blocks light in a specific wavelength band, for example, light in a wavelength band excluding a visible light band. The optical film 400 may include a film that blocks light in, for example, an ultraviolet (UV) wavelength band.

As shown in FIG. 15, the optical film 400 may be disposed on the thin-film encapsulation layer 300 or disposed on the backside of the substrate 100. Alternatively, two optical films 400 may be respectively disposed on the backside of the substrate 100 and a top surface of the thin-film encapsulation layer 300.

Figure 16:
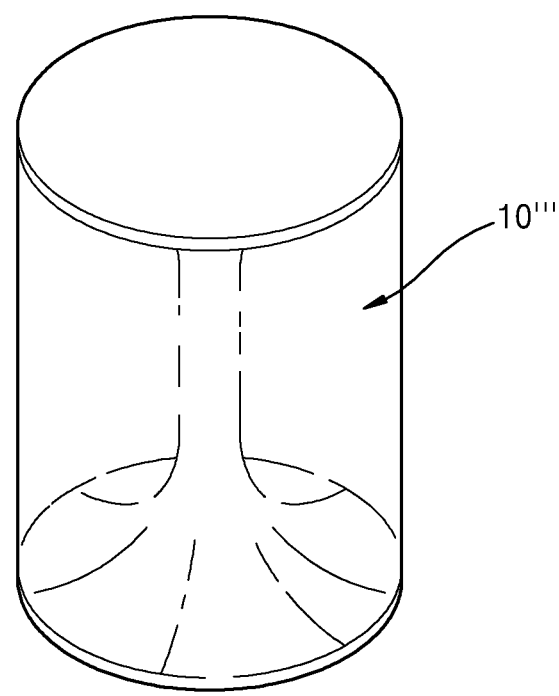
FIG. 16 is a perspective view of a display device according to an embodiment.

FIG. 16 is a perspective view of a display device 10''' according to another embodiment.

Referring to FIG. 16, the display device 10''' may include a speaker or an artificial intelligence speaker. At least one of surfaces constituting the display device 10''', for example, a lateral surface may have the characteristics according to the embodiments described with reference to FIGS. 3 to 11. For example, as described above, because the display device 10''' has a transmissive area, a structure provided inside the speaker or the artificial intelligence speaker may be viewed by an external user.

A display device according to embodiments may improve an emission efficiency of light emitted from a display element, improve brightness, and improve the life of the display device.

However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
    a substrate;
    a first pixel unit disposed over the substrate and including at least two pixel areas emitting lights of different colors;
    a second pixel unit neighboring the first pixel unit along a first direction and including at least two pixel areas emitting lights of different colors;
    a third pixel unit neighboring the first pixel unit along a second direction and including at least two pixel areas emitting lights of different colors;
    a first opposite electrode disposed on an area corresponding to the first pixel unit;
    a second opposite electrode disposed on an area corresponding to the second pixel unit; and
    a third opposite electrode disposed on an area corresponding to the third pixel unit,
    wherein the first pixel unit includes a first pixel area and a second pixel area that neighbor each other, the second pixel unit includes a third pixel area and a fourth pixel area that neighbor each other, and the third pixel unit includes a fifth pixel area and a sixth pixel area that neighbor each other,
    wherein a first distance between the first pixel area and the second pixel area is less than a second distance between the third pixel area and the first pixel area that neighbors the third pixel area without any intervening pixel area disposed between the third pixel area and the first pixel area, and
    wherein the first distance between the first pixel area and the second pixel area is less than a third distance between the fifth pixel area and the first pixel area that neighbors the fifth pixel area without any intervening pixel area disposed between the first pixel area and the fifth pixel area.

2. The display device of claim 1, wherein the first opposite electrode is a single body covering the first pixel area and the second pixel area, and the second opposite electrode is a single body covering the third pixel area and the fourth pixel area that neighbors the third pixel area.

3. The display device of claim 1, wherein an end portion of the first opposite electrode and an end portion of the second opposite electrode overlap each other.

4. The display device of claim 3, wherein the end portion of the first opposite electrode directly contacts the end portion of the second opposite electrode.

5. The display device of claim 3, wherein an overlapping part of the end portion of the first opposite electrode and the end portion of the second opposite electrode is disposed between the first pixel area and the third pixel area.

6. The display device of claim 1, wherein the first opposite electrode and the second opposite electrode include a same material.

7. The display device of claim 1, further comprising:
a first pixel electrode disposed in the first pixel area, a second pixel electrode disposed in the second pixel area, and a third pixel electrode disposed in the third pixel area; and
a pixel-defining layer including openings respectively overlapping the first pixel electrode, the second pixel electrode and the third pixel electrode.

8. The display device of claim 7, wherein each of an edge of the first opposite electrode and an edge of the second opposite electrode is disposed on a top surface of a portion of the pixel-defining layer disposed between the first pixel electrode and the third pixel electrode.

9. The display device of claim 7, wherein the substrate includes a transmissive area that neighbors the first pixel unit and the second pixel unit, and the pixel-defining layer includes a hole corresponding to the transmissive area.

10. The display device of claim 9, wherein an edge of one of the first opposite electrode and the second opposite electrode neighbors an edge of the pixel-defining layer defining the hole.

11. The display device of claim 1, wherein the first pixel unit comprises the first pixel area that corresponds to a red pixel area and the second pixel area that corresponds to a green pixel area, the second pixel unit comprises the third pixel area that corresponds to a green pixel area and neighbors the red pixel area of the first pixel unit, and the first distance between the red pixel area of the first pixel unit and the green pixel area of the first pixel unit is less than a second distance between the green pixel area of the second pixel unit and the red pixel area of the first pixel unit.

12. The display device of claim 1, wherein the first pixel unit comprises the first pixel area that corresponds to a blue pixel area and the second pixel area that corresponds to a green pixel area, the second pixel unit comprises the third pixel area that corresponds to a green pixel area and neighbors the blue pixel area of the first pixel unit, and the first distance between the blue pixel area of the first pixel unit and the green pixel area of the first pixel unit is less than the second distance between the green pixel area of the second pixel unit and the blue pixel area of the first pixel unit.

13. A display device comprising:
a substrate;
a first pixel unit disposed over the substrate and including a first pixel area and a second pixel area emitting lights of different colors;
a second pixel unit neighboring the first pixel unit along a first direction and including a third pixel area that neighbors the first pixel unit and a fourth pixel area emitting lights of different colors;
a third pixel unit neighboring the first pixel unit along a second direction and including a fifth pixel area that neighbors the first pixel unit and a sixth pixel area emitting lights of different colors;
a first pixel electrode disposed in the first pixel area;
a second pixel electrode disposed in the second pixel area that neighbors the first pixel area;
a third pixel electrode disposed in the third pixel area;
a fourth pixel electrode disposed in the fifth pixel area; and
a pixel-defining layer including openings respectively overlapping the first pixel electrode, the second pixel electrode, the third pixel electrode and the fourth pixel electrode,
wherein a first width of a first potion of the pixel-defining layer that is disposed between the first pixel electrode and the second pixel electrode is less than a second width of a second portion of the pixel-defining layer that is disposed between the first pixel electrode and the third pixel electrode that neighbors the first pixel electrode without any intervening pixel electrode disposed between the first pixel electrode and the third pixel electrode, and
wherein the first width of the first potion of the pixel-defining layer that is disposed between the first pixel electrode and the second pixel electrode is less than a third width of a third portion of the pixel-defining layer that is disposed between the first pixel electrode and the fourth pixel electrode that neighbors the first pixel electrode without any intervening pixel electrode disposed between the first pixel electrode and the fourth pixel electrode.

14. The display device of claim 13, further comprising:
a first opposite electrode and a second opposite electrode that are disposed respectively corresponding to the first pixel unit and the second pixel unit,
wherein the first opposite electrode is electrically connected to the second opposite electrode.

15. The display device of claim 14, wherein an end portion of the first opposite electrode and an end portion of the second opposite electrode directly contact each other.

16. The display device of claim 15, wherein the end portion of the first opposite electrode and the end portion of the second opposite electrode overlap each other.

17. The display device of claim 15, wherein a contact area of the first opposite electrode and the second opposite electrode is disposed between the first pixel area and the third pixel area.

18. The display device of claim 14, wherein the first opposite electrode and the second opposite electrode include a same material.

19. The display device of claim 18, wherein the first opposite electrode and the second opposite electrode each includes Ag, Mg, or an alloy of Ag and Mg.

20. The display device of claim 13, wherein a first gap between the first pixel electrode and the second pixel electrode is less than a second gap between the first pixel electrode and the third pixel electrode.

21. The display device of claim 13, wherein the substrate includes a transmissive area that neighbors the first pixel unit and the second pixel unit, and the pixel-defining layer includes a hole corresponding to the transmissive area.

22. The display device of claim 13, wherein the first pixel electrode, the second pixel electrode, and the third pixel electrode each include a reflective layer.

23. The display device of claim 13, wherein the first pixel area of the first pixel unit is a red pixel area or a blue pixel area, the second pixel area of the first pixel unit is a green pixel area, and the third pixel area of the second pixel unit is a green pixel area.

* * * * *